ASSEMBLY TOOL

Filed Feb. 25, 1966 2 Sheets-Sheet 1

INVENTORS
WALTER F. HUTCHINSON
GERALD G. KOSS
LELAND E. WICKSTRUM
BY Roger A. Marrs
AGENT INVENTORS
WALTER F. HUTCHINSON
GERALD G. KOSS
LELAND E. WICKSTRUM
BY Roger A. Marrs
AGENT United States Patent Office 3,391,464
Patented July 9, 1968

3,391,464
ASSEMBLY TOOL

Walter F. Hutchinson, Thousand Oaks, Gerald G. Koss, Simi, and Leland E. Wickstrum, Santa Susana, Calif., assignors to The Bunker-Ramo Corporation, Stamford, Conn., a corporation of Delaware Filed Feb. 25, 1966, Ser. No. 530,177
9 Claims. (Cl. 33—174)

A tool for use in the manufacture of electronic circuit boards for facilitating the placement of specified electronic parts on ends of lugged terminals arranged in spaced apart rows. The tool is comprised of a substantially flat structure shaped to define a plurality of parallel extensions defining interstices therebetween. The interstices are adapted to accommodate the rows of terminals so that indicia carried by the extensions can indicate the particular electronic part to be placed between each opposed terminal pair.

This invention relates to a novel assembly tool and method for rapidly and effectively specifying locations of selected terminals to which a variety of electrical components are intended to be connected during the course of manufacturing relatively complex electronic circuit boards such as may be employed in computers, data handling systems, and other electronic equipment.

In the manufacturing and assembling of electronic circuit boards, it has been a conventional practice to employ a base or strip foundation of electrically insulating material having apertures in which a plurality of electrically conductive terminals are held in a row and on which electronic components and circuitry or assemblies are mounted. A conventional form of terminal comprises a member generally stamped from sheet metal and consisting of an elongated pin portion provided at one end with a U-shaped lug. The circuit boards generally provide for the pin side of the terminal to project from one side of the circuit board so that various wiring and external circuit conductors may be wire wrapped to the pin side of the terminal. It is customary to project the opposite end or lug end of the terminal from the other side of the circuit board for accommodating the connection of various circuit components. In a typical circuit board assembly, the terminal bases or strips are arranged in spaced parallel relationship with respect to each other on the circuit board wherein selected pairs of terminals from the rows carried by adjacent terminal strips are aligned with one another to define a component receiving space or area therebetween. Each pair of terminals is adapted to support a part or electrical component such as a resistor, diode, capacitor, bus strip, etc. Some of the electrical components to be attached to the circuit board generally include terminal or lead wires extending from opposite ends of the components which are received within the space provided by the U-shaped lug of each pair of aligned terminals so that the components lie therebetween. Normally, mechanical conection is made so that the components will be retained on the terminals until a more permanent securement can be effected, such as by soldering, for example.

It has been the conventional practice to specify locations of selected electrical components to be mounted between particular pairs of terminals by employing component lists or tables which are prepared that clearly indicate terminal row and column location of each component or part to be mounted on the circuit board. The table or list is generally prepared from a wiring diagram which specifies a particular part or component or the absence of any part or component for each of the locations identifiable by a pair of aligned terminals. The list or table identifies each of the terminals by its associated row and column number. In application, an assembler is simply given a circuit board having terminal strips mounted thereon so that the plurality of terminals reside in rows and columns and a table specifying the part location keyed to particular terminals by row and column number. By reading the instructions from the table and continuously checking the actual location of the parts on the circuit board, the assembler can match the location of specified terminals on the circuit board with the specified location of parts indicated on the list or table so that he need only take the list-indicated part from a storage bin and place the part on the pair of terminals specified by the list or table.

Difficulties and problems have been encountered when employing the above-described technique for locating a variety of electrical components onto specified terminals carried by a circuit board inasmuch as even skilled assemblers make repeated mistakes which are discovered upon inspection and therefore require extensive re-work, which is extremely time consuming and inefficient. Furthermore, the component location tables or lists require many hours of preparation, and human error is introduced into such preparation, so that oftentimes a skilled assembler may carry mistaken component part location identification directly onto the circuit board being assembled.

Obviously, an assembly would be greatly facilitated if the circuit board itself were provided with indicia or markings indicating where the parts to be assembled should be mounted. However, there are several disadvantages in such a procedure. Firstly, a number of indicia bearing boards would be required, each with completely different layouts so that the total number of different boards to be held in stock would increase greatly, and, secondly, such a procedure would be extremely cumbersome to effectuate or to take into account engineering changes, such as may from time to time be found desirable. Also, current assembly practice sometimes necessitates the mounting of two or more components on the same terminals so that confusion may occur if the information or coding relative to the various components to be mounted are presented to an assembler simultaneously.

Accordingly, a novel assembly tool and assembly procedure is provided by the present invention for manufacturing electronic circuit boards in which each of certain specified electronic parts are to be placed on a pair of oppositely disposed ends of lugged terminals that are arranged in a plurality of parallel rows fixed to the circuit board. The novel tool includes a substantially rigid structure having a plurality of fingers or extensions extending in one direction from a base in fixed spaced parallel relationship with respect to each other. The fingers or extensions are insertably disposed between adjacent rows of terminals and slide into an installed position in which the extensions fill the lowermost area of the space between the rows of terminals. Each of the extensions is provided with a plurality of indicia or symbols strategically arranged thereon at locations corresponding to selected ones or all of oppositely disposed pairs of terminals. Each of said indicia indicates a particular part that is to be assembled between the pairs of terminals corresponding to the location identified by the particular indicium. A feature of the present invention resides in the fact that a plurality of such assembly tools may be accommodated between the columns of terminals as by stacking one tool on the other so that an uppermost first tool having a set of part type and location identifying indicia marked thereon may be employed to designate specific terminals for receiving a first type or types of component parts. Thereafter the first tool may be removed to expose a second tool immediately beneath the first tool having indicia identifying the location of a second type or types of component so that second type parts as indicated on the second tool may be additionally mounted on the terminals already holding first type parts as previously mounted in accordance with the indicia of the first tool. By using such a tool having symbols or coded designations for particular components to be mounted on the circuit board between specified terminals, wiring lists or tables are rendered unnecessary, and the chances for human error are greatly reduced. Furthermore, indicia or other coded symbols may be readily changed on the fingers or extensions as desired, to accommodate any engineering changes which may occur. By the use of such a tool, detailed comparison of wiring lists and tables with the actual rows and columns of terminals on a circuit board are rendered unnecessary, and assembly time in the manufacturing of circuit boards is greatly decreased.

The present invention also provides for a plurality of storage bins situated at an assembler's station for holding a plurality of various electronic parts. Each bin of the plurality is marked with a special symbol or indicium uniquely identifying the components or parts which are held in that particular bin. These symbols or indicia are made to correspond in appearance to the symbols and indicia on the fingers of the assembly tool just described, all to the extent of increasing the speed with which an assembler may procure and assemble parts as specified by the indicia or symbols on the assembly tool fingers. By employing such bins and bin identifying indicia, the assembler need only visually compare symbols displayed on the extensions of the tool with those displayed on the component part bins to procure the necessary components and identify the specific locations for the assembling thereof. In fact, through the use of this method, an assembler need not even know the purpose, function, or nomenclature of specific components for which it is the assembler's responsibility to mount. Therefore, the task of assembling component parts onto a circuit board is greatly simplified.

Therefore, the novel assembly tool of the present invention provides a means for aiding an assembler to more rapidly and efficiently mount a variety of electrical components or parts between aligned terminals carried by a circuit board by displaying symbols or coding which identifies specific terminal locations so that a variety of electronic components or parts may be readily mounted thereon without the necessity of employing lists or tables.

The features of the present invention which are believed to be novel are set forth with particularity in the appended claims. The present invention, both as to its organization and manner of operation, together with further objects and advantages thereof, may best be understood by reference to the following description taken in connection with the accompanying drawings, in which:

Figure 1:
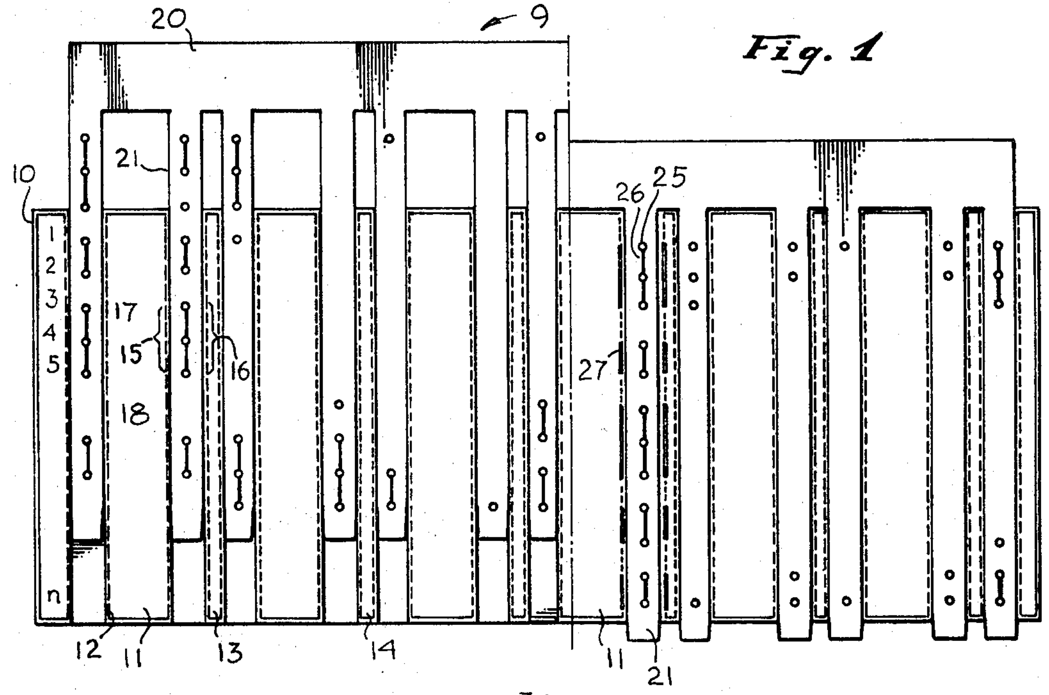
FIGURE 1 is a top plan view of one embodiment of the novel assembly tool incorporating the present invention illustrating the successive positions of the tool during an assembly procedure for identifying the location of selected terminals carried by a circuit board which are intended to mount electrical components such as bus strips.

Referring to FIG. 1 of the drawings, an assembly tool or template in accordance with the present invention is shown in the general direction of arrow 9, which is used in conjunction with a circuit board as indicated by numeral 10. The circuit board is preferably composed of electrically nonconductive material and includes a planar surface on which a plurality of terminal strips or base foundations, such as base 11 for example, are mounted by suitable means. Each base or strip foundation is composed of electrically insulating material and has a plurality of apertures arranged in an in-line relationship in which a plurality of electrically conductive terminals are held in parallel rows along the longitudinal edge marginal region thereof and on which electrical components and circuitry or assemblies are mounted. Numeral 12 indicates a row of terminals carried on terminal strip 11, which terminals are more fully shown by way of example in FIG. 3.

It is to be noted that the width of the terminal strips or bases may vary and that the number of usable terminals on each strip may vary depending upon the particular circuit arrangement to be incorporated onto the circuit board. As illustrated, terminal strip 11 is relatively wide as compared to terminal strip 13 and terminal strip 14; however, the plurality of multiplicity of terminal strips are arranged in fixed parallel spaced relationship regardless of the width of the strip and the distance between adjacent parallel terminal strips is substantially constant throughout the length of the circuit board 10. By such an arrangement, a plurality of terminals, such as represented by numeral 15, in one row of terminals and terminals 16 in an adjacent row of terminals carried on strip 13 are aligned in a direction normal to the longitudinal axis of each row of terminals so that a space is defined therebetween to accommodate the mounting of components.

A conventional form of terminal is employed which comprises a member generally stamped from sheet metal and consisting of an elongated pin portion provided at one end with a U-shaped lug. The circuit board as illustrated provides for the pin side of the terminal to project from one side of the circuit board (not shown) so that various wiring and external circuit conductors may be wire wrapped to the pin side thereof. However, it is to be noted that the opposite end or lug end of the terminal projects from the other side of the circuit board for accommodating the connection of various circuit components, such as resistors, diodes, capacitors, bus bars, transistors, etc. For purposes of identifying each terminal's position on the circuit board, the planar face of the board is generally provided with markings indicating columns such as are represented by the numbers 1, 2, 3, 4, 5 . . . *n* displayed on the extreme left side of the circuit board 11. To identify various rows, each terminal base or strip may be employed to display other indicia or markings, such as letters of the alphabet. Therefore, by using conventional coordinate techniques, any terminal or pair of terminals on the face of the circuit board can be readily located.

Figures 2, 3:
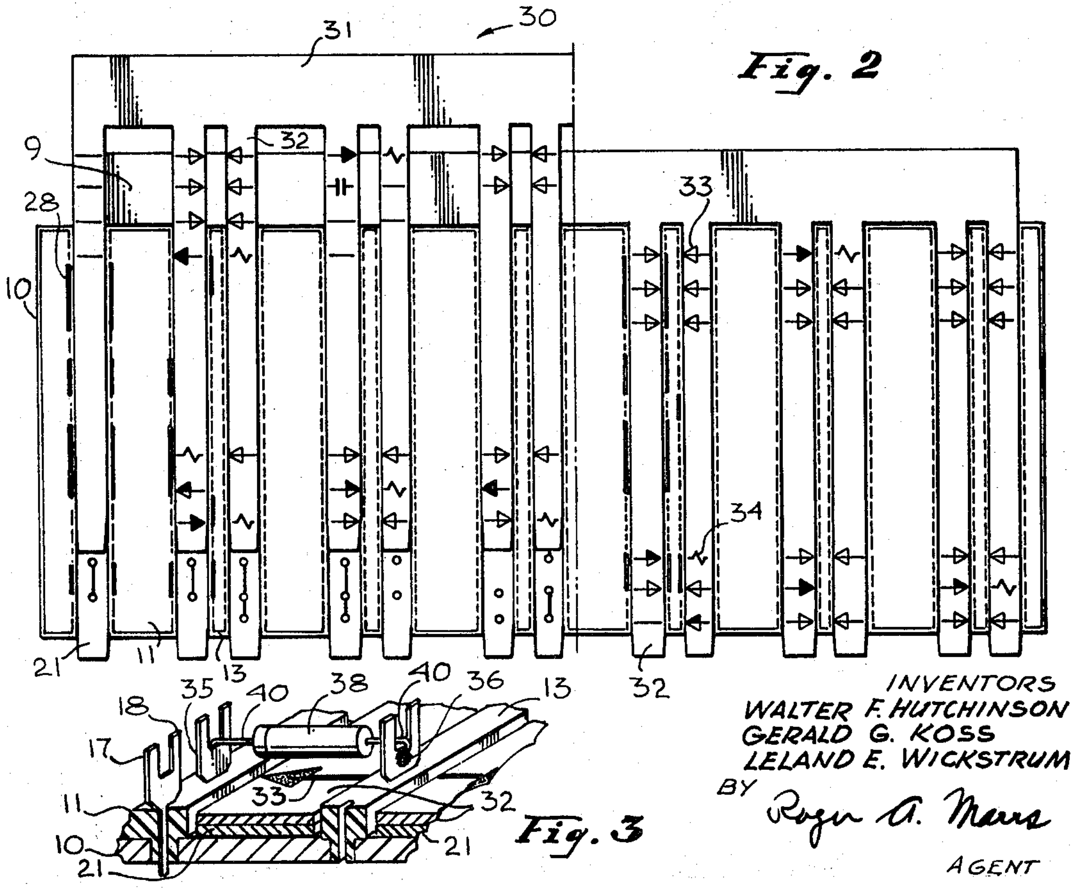
FIG. 2 is a top plan view of another embodiment of the assembly tool of the present invention illustrating successive tool positions for locating other electrical components such as diodes and resistors on selected terminals of the circuit board employed in FIG. 1.
FIG. 3 is an enlarged perspective view, partly in section, of a portion of the assembly tool in position on the circuit board as taken in the direction of arrows 3—3 of FIG. 2.

Inasmuch as the present invention relates to a template or device for locating particular terminals to which specified components are to be attached, only the lug portions of the terminals are shown in FIG. 3 so that each U-shaped lug includes a pair of spaced-apart elements 17 and 18, such as are associated with the terminal 15 on terminal strip 12.

The assembly tool 9 comprises in one embodiment thereof a planar sheet of material formed into a base section 20, from which a plurality of extension, such as extension 21, extend in the same direction outwardly from the same side of the base section 20. The extensions are arranged in fixed spaced parallel relationship with each other and are preferably integrally formed with the base section 20. The distance or spacing between the extensions is such as to match the shape and dimension of the terminal strips, and the width of each extension is determined by the distance between adjacent terminal strips. When the extensions are properly spaced with respect to each other and the width of each extension arranged to accommodate the spacing between the adjacent terminals, the extensions can be moved in sliding engagement from one end of the circuit board in the direction of the terminal strips toward a position in which the extensions will fill the lowermost area of the space existing between adjacent terminal strips. Such a positioning of the assembly tool is shown in FIG. 1 on the right-hand side of the drawing. The extent of extension insertion is limited by the abutment of segment portions of the base portion 20 with the end of the terminal strips.

Suitably carried on each extension of the assembly tool are a plurality of indicia strategically located on the face thereof indicating the particular symbol or marking representing a particular part or electrical component that is to be assembled adjacent the location identified by the indicia or symbol. Once the assembly tool has been inserted over a circuit board between the spaces existing between adjacent terminal strips, the particular indicia or symbols will be disposed between opposing pairs of terminals as shown by the assembly tool on the right-hand side of FIG. 1 of the drawings. The indicia as shown in FIG. 1 represent a symbol 25 representative of a terminal and a solid line or bar 26 interconnecting selected terminal symbols in the same row. The symbols for the terminal 25 and the bar 26 may be suitably applied to the face of the extension by any suitable means such as by inscribing, printing, or, if more feasible, employing a pressure-sensitive tape having the symbols marked on the exposed side thereof. In this instance, the symbol 26 represents a bus bar which is to be connected between a plurality of terminals such as are indicated by the symbol 25. In some instances, the bus bar is intended to interconnect three terminals; in other instances, the bus bar may interconnect four terminals; and, in other instances, the bus bar may be intended to interconnect only two terminals. The terminals which are intended to be interconnected are joined by the bus bar symbol 26 which extends between the terminals to be interconnected.

The symbol 26 represents a bus strip or bar which is intended to interconnect a plurality of terminals which are in the same row. Therefore, a bus strip 27 is shown interconnecting a pair of adjacent terminals in the same row. However, it is to be understood that additional terminals may be interconnected by the same continuous bus strip if desired. A particular bus strip which has been found desirable for interconnecting terminals is more clearly described in detail in a copending patent application, Ser. No. 408,888, filed Nov. 4, 1964, entitled "Electrical Bus Strip." Such a bus strip includes a strip of electrically conductive material which is adapted to be installed on the component side of the circuit board. The bus strip is readily secured to the U-shaped component attachment portion of a terminal by manually bending the strip over the terminal lugs into clamping engagement with the terminal. The bus strip is provided with a plurality of elongated apertures through which the lugs of adjacent terminals may be received so that the length of the strip may seat snugly and firmly in contact with both sides of the component attachment side of the terminal when the bus strip has been properly installed.

Referring now to FIG. 2, the assembly tool 9 is illustrated in its inserted position on the circuit board substantially as shown on the right-hand side of FIG. 1 of the drawings. Furthermore, the circuit board 10 shown in FIG. 2 includes the installation of the bus strip, such as represented by a bus strip 28, onto the selected terminals in the multiplicity oft erminal rows. In order to locate selected terminals to which additional electrical components or parts are to be attached, a second assembly tool, indicated in the general direction of arrow 30, is employed that is substantially similar in construction to the assembly tool 9. The assembly tool 30 includes a base section 31 and a plurality of spaced-apart parallel extending fingers or extensions 32 which are insertably received within the spaces or areas existing between adjacent terminal strips in a fashion similar to the insertion and positioning of the assembly tool 9. The assembly tool 30 is slid into position on the top surface of the tool 9 which rests in place on the face of the circuit board 10. When the assembly tool 30 has been positioned to the extent that the base section 31 engages the end of the terminal strips, the assembly tool 9 will be totally covered, as illustrated more clearly on the right-hand side of FIG. 2.

The symbols displayed on the extensions 32 of the assembly tool 30 are representative of other components or parts to be mounted between selected pairs of terminals carried on adjacent terminal strips. For example, the arrow symbol 33 is intended to represent a diode, and the direction of the arrow indicates the polarity of the diode. Another symbol 34 is employed to represent a resistor. The symbols 33 and 34 are disposed across the width of each extension so as to extend between aligned terminals selected to receive and mount the actual component called for by the symbol extending therebetween.

Referring now to FIG. 3, an enlarged perspective view, partly in section, of a portion of the circuit board and assembly tools shown in FIG. 2 is illustrated. The assembly tool 9 and its associated extensions are illustrated as being disposed in the area of space between adjacent terminal strips and resting on the top surface of the circuit board 10. The extensions 32 of the assembly tool 30 are shown disposed on top of the assembly tool extensions 21, and the symbol 33 is shown extending between aligned terminals such as represented by numerals 35 and 36. Once the assembly tool 30 has been positioned, an assembler may readily mount an electrical component such as is represented by numeral 38, which in the present instance may be a diode corresponding to the symbol 33 between the terminals 35 and 36. Normally, the component includes lead wires 40 projecting from its opposite ends which may be received within the spaces between the lug elements 17 and 18 on each terminal. Final securement of the component to the terminal can be effected by such conventional means as soldering.

Preferably, the assembly tool 9 is first used so that components such as bus strips may be initially installed, since these components interconnect adjacent terminals in the same row and normally seat well below the projecting ends of the terminal lugs. Subsequent installation of additional components, such as diodes or resistors, may be readily accommodated on top of the previously installed bus strips by the use of assembly tool or template 30.

Following the securement of the various components and parts that are mounted between terminals, both assembly tools 9 and 30 may be slid rearwardly beneath the components and parts to complete the finished and assembled circuit board. A feature of the invention resides in the fact that the assembly tools 9 and 30 may be employed as inspection tools at any time after the board has been assembled. The tool extensions can be readily inserted beneath the component parts between adjacent terminal strips and moved into position. An inspector may visually associate the installed components with the symbol nomenclature to determine the correctness of assembly.

Figure 4:
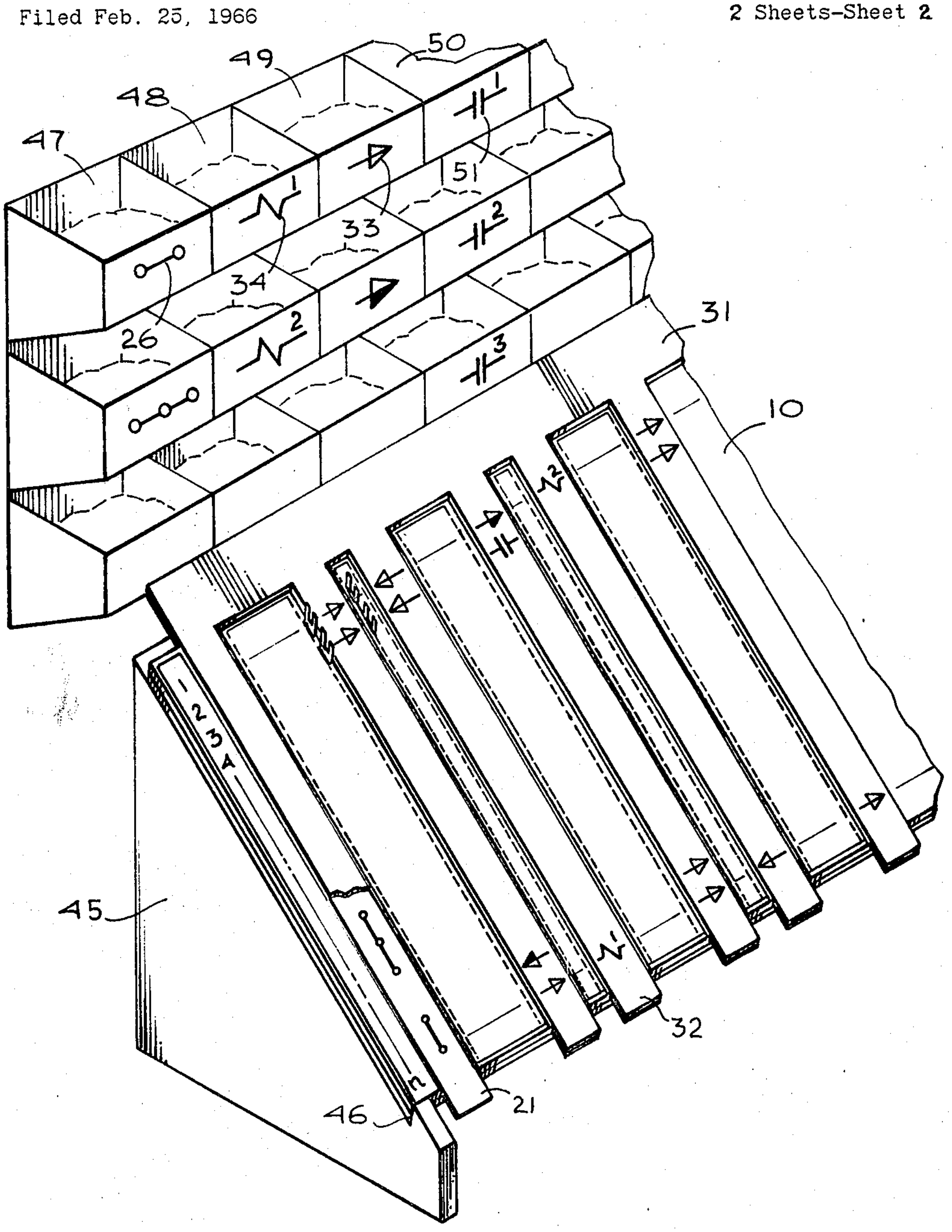
FIG. 4 is a perspective view of an assembler's station on a work bench illustrating component storage bins, a circuit board, and the assembly tools of FIG. 2 positioned thereon.

Referring now to FIG. 4, a stand 45 is illustrated having a supporting lip 46 on which a printed circuit board may be temporarily held while the various component parts are being assembled thereon. The stand 45 is intended to be located on the work bench at an assembler's station, and the circuit board 10 is preferably supported in a substantially upright position so that the indicia or symbols displayed on the extensions of the tools 9 and 30 may be visibly read by the assembler positioned in the front of the stand. In close proximity to the stand 45, the method of the present invention provides for the inclusion of a plurality of storage bins, such as indicated by numerals 47 to 50, inclusive, which are employed for holding a quantity of components intended to be mounted on the circuit board 10. Each of the bins of the plurality are individually marked with the same symbols which are displayed on the assembly tools 9 and 30; that is to say, bus bars or strips may be located in bin 47 displaying the symbol 26 on the front face thereof, and resistors may be placed in the bin 48 displaying the resistor symbol 34. Storage bin 49 may be employed for holding a quantity of diodes and displays the diode symbol 33. Additional bins may be included in the plurality for holding other components, such as bin 50 for holding capacitors which may be identified by a symbol 51. The method of the present invention may be practiced by initially inserting the assembly tools 9 and 30 as previously described between adjacent rows of terminals intended to mount a variety of components which are stored in the storage bins 47 to 50. Once the assembler has inserted the assembly tools in position, various symbols carried on the face of the assembly tool extension will line up and match between selected pairs of terminals carried by the board 10. By visual inspection, the assembler will observe a specific symbol extending between terminals and remove a component from a particular bin having a similar symbol mark thereon. This component can then be placed over the symbol carried by the assembly tool and connected onto the terminals so indicated by the symbol.

When assembly tool 9 is in place, the extensions 21, through symbols directly adjacent the terminals, indicate interconnections between terminals in the same row for the particular circuit board. Suitable bus strips, cut to the proper length for each interconnection, are placed over the terminals in the same row and then quickly crimped into place by any suitable means. The second set of fingers or extensions as carried by assembly tool 30, showing specific component type and polarity at each terminal location, are inserted over the first tool 9 and specified components are attached between particular pairs of terminals taken from adjacent terminal rows. After the components are attached to the board, the templates or assembly tools are readily removed, and the completed circuit board is ready for washing or additional assembly.

By placing the interconnections and component instructions directly on the circuit board via the symbol displaying extensions of the assembly tool, as compared to the use of a wiring list located somewhere else at the assembler's working station, the opportunity for error and costly re-work is substantially reduced. Additionally, the assembly tools of the present invention can also be used for a quick and accurate check of the finished circuit boards to insure that component assembly is correct.

The present invention contemplates that the symbols or indicia employed to represent various electronic components or parts may be color coded for even more rapid visual comparison. For example, diodes may be colored green, while resistors may be colored red and bus strips brown. The particular color symbol displayed by the assembly tools 9 and 30 is matched with the identical color symbol coding of the plurality of bins.

Therefore, the novel assembly tool and method herein described greatly simplify the problem of attachment of discrete components to electronic circuit boards. The invention reduces the need for time consuming decisions at the production level through the use of the assembly tools and method as described herein. Conventional bus wiring is eliminated, and accuracy of workmanship is easily verified by cross-checking to the assembly tools.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

The embodiments of the invention in which an exclusive property or privilege is claimed are defined as follows:

1. A tool for use in the manufacture of electronic circuit boards in which each of certain specified electronic parts is to be placed on ends of lugged terminals, said terminals being arranged in a plurality of parallel spaced-apart rows carried on terminal strips fixed to the board, the tool comprising:

a flat structure shaped to define a plurality of extensions extending in one direction in fixed spaced parallel relationship, and to define interstices between said extensions shaped so as to match the rows of the terminals so that the structure can be moved in sliding engagement from one end of the board in the direction of the rows toward a position in which said extensions fill the lowermost area of the space between the rows of terminals; and a plurality of indicia carried by said extensions at the location of each of at least certain ones of the terminals, each of said indicia indicating a particular part that is to be assembled on the certain ones of the terminals identified by particular indicia.

2. The invention as defined in claim 1 wherein said indicia include a variety of symbols corresponding to a variety of specific electronic components intended to be assembled on the circuit board and wherein said symbols are arranged in fixed spaced relationship along the length of each of said extensions of said plurality whereby each symbol is aligned with respect to selected terminals in the terminal rows to designate the location of assembly for the specific electronic component selected from said variety corresponding to said symbol.

3. The invention as defined in claim 2 wherein said plurality of indicia carried by said extensions are at the location of at least certain pairs of oppositely disposed pairs of terminals, and wherein each of said indicia indicates a particular part that is to be assembled over the location identified by the particular indicium.

4. The invention as defined in claim 2 wherein said plurality of indicia carried by said extensions are at the location of at least two terminals in the same row of terminals, and wherein each of said indicia indicates a particular part that is to be assembled between the terminals in the same row identified by particular indicia.

5. The invention as defined in claim 4 including a second flat structure substantially identical to said first-mentioned structure except that said plurality of indicia carried by the extensions thereof are at locations of at least certain pairs of oppositely disposed pairs of terminals, wherein each of said last-mentioned indicia indicates a particular part that is to be assembled over the location identified by the particular indicium, said second structure being situated on top of said first-mentioned structure in a stacked relationship.

6. The invention as defined in claim 2 wherein the width of each extension of said plurality is such that the space defined by adjacent rows of terminals is substantially filled in a plane extending over the circuit board, and wherein the length of each extension of said plurality exceeds the length of the circuit board.

7. The invention as defined in claim 6 wherein said structure includes a flat body portion extending along the width of the circuit board from which said extensions project so that segment portions of said body portion are defined between adjacent ones of said extensions operable to engage one end of the terminal strips carrying the rows of terminals to limit movement of the tool over the circuit board.

8. The invention as defined in claim 7 wherein said indicia are removably secured to said extensions.

9. The invention as defined in claim 8 wherein said indicia are color coded to represent a variety of electronic components to be assembled on the circuit board.

References Cited

UNITED STATES PATENTS

| | | | |
|---|---|---|---|
| 3,196,522 | 7/1965 | Bernstein et al. | 29—626 |
| 3,266,162 | 8/1966 | Burke | 33—174 |

SAMUEL S. MATTHEWS, *Primary Examiner.*